(12) United States Patent
Yasumura et al.

(10) Patent No.: US 10,163,740 B2
(45) Date of Patent: Dec. 25, 2018

(54) SEMICONDUCTOR DEVICE

(71) Applicant: Renesas Electronics Corporation, Tokyo (JP)

(72) Inventors: Bunji Yasumura, Kanagawa (JP); Fumio Tsuchiya, Kanagawa (JP); Hisanori Ito, Kanagawa (JP); Takuji Ide, Kanagawa (JP); Naoki Kawanabe, Kanagawa (JP); Masanao Sato, Kanagawa (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/785,531

(22) Filed: Oct. 17, 2017

(65) Prior Publication Data

US 2018/0040521 A1 Feb. 8, 2018

Related U.S. Application Data

(60) Continuation of application No. 15/280,618, filed on Sep. 29, 2016, now Pat. No. 9,824,944, which is a
(Continued)

(30) Foreign Application Priority Data

May 20, 2009 (JP) ................................. 2009-121857

(51) Int. Cl.
*H01L 21/66* (2006.01)
*H01L 23/00* (2006.01)
(Continued)

(52) U.S. Cl.
CPC .......... *H01L 22/32* (2013.01); *H01L 23/3114* (2013.01); *H01L 23/49816* (2013.01);
(Continued)

(58) Field of Classification Search
CPC ....................................................... H01L 24/05
See application file for complete search history.

(56) References Cited

U.S. PATENT DOCUMENTS 9,824,944 B2 * 11/2017 Yasumura ............... H01L 24/05
2002/0125584 A1 9/2002 Umehara et al.
(Continued)

FOREIGN PATENT DOCUMENTS

CN 1531044 A 9/2004
JP 03-079055 A 4/1991
(Continued)

OTHER PUBLICATIONS

Office Action dated Jul. 24, 2015, in Taiwanese Patent Application No. 099112370.

*Primary Examiner* — Fernando L Toledo
*Assistant Examiner* — Valerie N Newton
(74) *Attorney, Agent, or Firm* — Shapiro, Gabor and Rosenberger, PLLC

(57) ABSTRACT

A technique is provided that can prevent cracking of a protective film in the uppermost layer of a semiconductor device and improve the reliability of the semiconductor device. Bonding pads formed over a principal surface of a semiconductor chip are in a rectangular shape, and an opening is formed in a protective film over each bonding pad in such a manner that an overlapping width of the protective film in a wire bonding region of each bonding pad becomes wider than an overlapping width of the protective film in a probe region of each bonding pad.

9 Claims, 15 Drawing Sheets

Related U.S. Application Data continuation of application No. 14/589,547, filed on Jan. 5, 2015, which is a division of application No. 12/778,123, filed on May 12, 2010, now Pat. No. 8,946,705.

(51) Int. Cl.
*H01L 23/31* (2006.01)
*H01L 23/498* (2006.01)

(52) U.S. Cl.
CPC ........ *H01L 23/49838* (2013.01); *H01L 24/05* (2013.01); *H01L 24/06* (2013.01); *H01L 24/13* (2013.01); *H01L 24/48* (2013.01); *H01L 24/85* (2013.01); *H01L 24/45* (2013.01); *H01L 24/49* (2013.01); *H01L 24/73* (2013.01); *H01L 2224/02166* (2013.01); *H01L 2224/0401* (2013.01); *H01L 2224/04042* (2013.01); *H01L 2224/05073* (2013.01); *H01L 2224/05553* (2013.01); *H01L 2224/05624* (2013.01); *H01L 2224/0613* (2013.01); *H01L 2224/131* (2013.01); *H01L 2224/13099* (2013.01); *H01L 2224/16225* (2013.01); *H01L 2224/32225* (2013.01); *H01L 2224/45015* (2013.01); *H01L 2224/45144* (2013.01); *H01L 2224/4845* (2013.01); *H01L 2224/48091* (2013.01); *H01L 2224/48157* (2013.01); *H01L 2224/48227* (2013.01); *H01L 2224/48463* (2013.01); *H01L 2224/48465* (2013.01); *H01L 2224/48624* (2013.01); *H01L 2224/49171* (2013.01); *H01L 2224/73265* (2013.01); *H01L 2224/85203* (2013.01); *H01L 2224/85205* (2013.01); *H01L 2224/85207* (2013.01); *H01L 2224/85399* (2013.01); *H01L 2924/00012* (2013.01); *H01L 2924/00014* (2013.01); *H01L 2924/01004* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01022* (2013.01); *H01L 2924/01025* (2013.01); *H01L 2924/01033* (2013.01); *H01L 2924/01051* (2013.01); *H01L 2924/01079* (2013.01); *H01L 2924/01082* (2013.01); *H01L 2924/01083* (2013.01); *H01L 2924/04941* (2013.01); *H01L 2924/05042* (2013.01); *H01L 2924/10253* (2013.01); *H01L 2924/12041* (2013.01); *H01L 2924/14* (2013.01); *H01L 2924/15311* (2013.01); *H01L 2924/181* (2013.01); *H01L 2924/20752* (2013.01); *H01L 2924/20753* (2013.01); *H01L 2924/30107* (2013.01); *H01L 2924/3512* (2013.01)

(56) References Cited

U.S. PATENT DOCUMENTS

| | | |
|---|---|---|
| 2005/0194423 A1 | 9/2005 | Takanori |
| 2007/0228561 A1 | 10/2007 | Matsuki et al. |

FOREIGN PATENT DOCUMENTS

| | | |
|---|---|---|
| JP | 2000-164620 A | 6/2000 |
| JP | 2001-338955 A | 12/2001 |
| JP | 2007-318014 A | 12/2007 |

* cited by examiner

SEMICONDUCTOR DEVICE

CROSS-REFERENCE TO RELATED APPLICATION

The disclosure of Japanese Patent Application No. 2009-121857 filed on May 20, 2009 including the specification, drawings and abstract is incorporated herein by reference in its entirety.

BACKGROUND OF THE INVENTION

The present invention relates to a semiconductor device, in particular, to a technique effective to be applied to a semiconductor device with a semiconductor chip, having bonding pads, mounted thereon.

Japanese Patent Laid-Open No. 1991-79055 (Patent Document 1), for example, discloses an electrode pad provided with a first portion to bond a wire or a film lead and a second portion that is integrally linked to the first portion, can be recognized with a pattern distinct from the first portion, and makes contact with a probe needle in wafer testing.

Japanese Patent Laid-Open No. 2000-164620 (Patent Document 2) discloses a technique capable of secure inspection and bonding of a semiconductor device by having an electrode pad provided with an electrode region for bonding and a bonding region for inspection and separating the center of the electrode region for bonding and the center of the bonding region for inspection by a predetermined interval or more.

Japanese Patent Laid-Open No. 2001-338955 (Patent Document 3) discloses a wire bonding technique in which a bonding pad is provided with a bonding region and a probe contact region, where one end of a conductive wire is bonded to the bonding region and a tip end of a testing probe is made contact with the probe contact region.

Japanese Patent Laid-Open No. 2007-318014 (Patent Document 4) discloses a semiconductor device in which a plurality of pads having a first region and a second region are formed in a rectangular shape, where each pad has a chamfered portion in a part of the corners and the pads are aligned in zigzag and further the chamfered portions are provided oppositely in the pads in inner and outer rows of the zigzag alignment and the first region is disposed on the side of the core logic region of a semiconductor chip.

SUMMARY OF THE INVENTION

In semiconductor devices, a wire bonding connection system is used as one of the methods of connecting an integrated circuit formed over a principal surface of a semiconductor chip with a connection terminal (bonding lead, land, inner lead) or the like formed over a principal surface of a substrate with the semiconductor chip mounted thereon. Such a wire bonding connection system electrically connects bonding pads (electrode pads, metal pads) electrically connected to an integrated circuit formed over a principal surface of a semiconductor chip with a plurality of connection terminals formed over a principal surface of a substrate with the semiconductor chip mounted thereon using a plurality of bonding wires formed of metal thin wires (30 µmϕ, for example) of gold (Au) or the like, respectively.

During manufacture of such a semiconductor device, inspection (P inspection, probing) of basic functions and the like of an integrated circuit formed over a principal surface of a semiconductor chip is generally carried out before the assembly process (mounting process, post process). Such inspection typically makes probes contact with plurality of bonding pads at the same time in a state of a wafer to measure various electrical characteristics of the integrated circuit formed over the principal surface of the semiconductor chip. For this measurement, a probe card is used in which a large number of probes are disposed in advance in accordance with the disposition of all bonding pads over the semiconductor chip. The probe card is electrically connected to a tester and a signal corresponding to all of the probes is output from the probe card.

Bonding pads are sometimes damaged upon making probes contact with the bonding pads and thus the metal film (aluminum (Al) film, for example) constituting the bonding pads may be peeled off. In wire bonding connection, it is important that an alloy of the metal film constituting the bonding pads and the metal constituting the metal balls at the tip ends of the bonding wires is formed suitably to intensify the joint strength. However, as the metal film constituting the bonding pads is peeled off due to a contact of the probe, the region to form the alloy becomes smaller and there is a possibility of decreasing the joint reliability between the bonding pads and the metal balls. Therefore, in recent years, an approach of connecting bonding wires in a region not damaged by probes is employed by dividing a surface region of one bonding pad into a region of joining a bonding wire (wire bonding region) and a region of making contact with a probe (probe region).

FIGS. 16A and 16B illustrate one example of bonding pads that the present inventors have reviewed. FIG. 16A is a plan view of a major portion of a bonding pad, and FIG. 16B is an enlarged cross-sectional view of a major portion of FIG. 16A taken along a line A-A' therein. Although FIG. 16A illustrates two bonding pads as an example, there are actually approximately 300, for example, of bonding pads formed in one semiconductor chip.

As illustrated in FIGS. 16A and 16B, a bonding pad B1 contains a metal film containing an aluminum film with a thickness of, for example, 0.85 µm as a main material and has a rectangular shape with, for example, a dimension in a first direction of 60 µm and a dimension in a second direction perpendicular to the first direction of 125 µm. A distance between the adjacent bonding pads B1 is, for example, 5 µm. A surface region of each bonding pad B1 is divided into a wire bonding region B1w to be joined with a metal ball at a tip end of a bonding wire and a probe region B1p to be made contact with a probe.

A periphery of each bonding pad B1 is covered with a protective film (passivation film) 51. The protective film 51 is formed of a laminated film of, for example, a silicon oxide film 51a with a thickness of 0.2 µm and a silicon nitride film 51b with a thickness of 0.6 µm. The protective film 51 that runs over a periphery of the bonding pad B1 and covers the periphery of the bonding pad B1 has a width of, for example, 2.5 µm. A titanium nitride (TiN) film 52 with a thickness of, for example, 0.075 µm is formed between the protective film 51 and the bonding pad B1, which is a film provided for antihalation and has a function as an antireflection film in a photolithography process upon processing the metal film constituting the bonding pad B1.

However, there are various technical problems described below regarding the bonding pads B1 that have the wire bonding region B1w and the probe region B1p, illustrated in FIGS. 16A and 16B, distinct from each other. That is, it has become apparent that, when the metal ball at the tip end of the bonding wire runs over the periphery of the bonding pad B1 while joining the metal ball with the wire bonding region B1w of the bonding pad B1, a part of the protective film 51 cracks as ultrasonic waves are applied. FIG. 17 illustrates one example of a crack 53 in the protective film 51. The crack 53 is mainly generated in a side face of an end of the bonding pad B1 and also in a portion covered with a metal ball 54. Further, the crack 53 may also cause a failure, such as peel off of a part of the protective film 51, to be generated.

As such a failure is generated, moisture easily enters into the bonding pad B1 in, for example, HAST (highly-accelerated temperature and humidity stress test, testing conditions of 85° C./85%/Bias) or the like as one of the moisture resistance tests for semiconductor products. A potential difference is generated between the adjacent bonding pads B1 due to the entered moisture to shortcircuit between the adjacent bonding pads B1. Further, the entered moisture oxidizes the titanium nitride film 52 provided for antihalation and remaining between the protective film 51 and each of the bonding pads B1. The titanium nitride film 52 expands due to oxidation, and an interlayer insulating film provided between inner wirings in a layer lower than the bonding pad B1 is broken by a stress generated by the expansion, resulting in short-circuit between the inner wirings or between the bonding pad B1 and the inner wiring. Electrical failures, such as a short-circuit between the bonding pads B1, a short-circuit between the inner wirings, or a short-circuit between the bonding pad B1 and the inner wiring, severely decrease the reliability of the semiconductor device.

Cracking can be prevented from being generated in a protective film by, for example, changing the conditions upon joining the metal ball with the wire bonding region of the bonding pad. As one example of junction conditions for wire bonding, there is a technique of rubbing the bonding pad with the metal ball by vibration due to ultrasonic waves while, for example, applying a constant load of approximately 120 mN at a temperature of approximately 230 degrees. It is important to carry out wire bonding connection in such conditions to suitably form the alloy of the metal film constituting the bonding pad and the metal constituting the metal ball for intensification of the joint strength and it is difficult to modify the junction conditions (for example, temperature, load, time period to apply ultrasonic waves, and the like) without thorough consideration.

Cracking can also be prevented from being generated in the protective film by making the diameter of the metal ball smaller so as not to let the metal ball run over the periphery of the bonding pad. However, the region to form the alloy of the metal film constituting the bonding pad and the metal constituting the metal ball becomes smaller and there is a possibility of decreasing the joint reliability of the bonding pad and the metal ball.

Cracking can also be prevented from being generated in the protective film by enlarging the area of the bonding pad so as not to let the metal ball run over the periphery of the bonding pad. However, since the region occupied by the bonding pad increases as the area of the bonding pad is enlarged without changing the distance between the adjacent bonding pads, it turns out to require enlargement in size of the semiconductor chip. Although a method may also be considered to enlarge the area of the bonding pad by narrowing the dimension between the adjacent bonding pads, it is difficult to narrow the dimension further from the current status (approximately 5 μm) when considering the processing accuracy and the like.

Cracking can also be prevented from being generated in the protective film by widening the width of the protective film that overlaps the periphery of the bonding pad. However, as the width of the protective film that overlaps the periphery of the bonding pad is widened, the area of the probe region is reduced and there is a higher possibility that the probe makes contact with the protective film and the protective film is broken by the probe.

Cracking can also be prevented from being generated in the protective film by employing a structure in which the protective film does not overlap the periphery of the bonding pad. However, since the bonding pad is used as an etching stopper film when forming an opening in the protective film over the bonding pad after forming the protective film, it is not possible to employ a structure in which the protective film does not overlap the periphery of the bonding pad. After exposing a part of wiring of the uppermost layer by forming the wiring and the protective film of the uppermost layer and forming an opening in the protective film, a bonding pad can be formed that electrically connects to the wiring of the uppermost layer through the opening to employ a structure in which the protective film does not overlap the periphery of the bonding pad. However, since the wiring of the uppermost layer and the bonding pad are formed with metal films in layers different from each other, the number of steps, material costs, and the like increase to generate a problem of an increase in manufacturing costs for semiconductor devices.

The present invention has been made in view of the above circumstances and provides a technique that can improve the reliability of a semiconductor device by preventing cracking in a protective film of the uppermost layer of the semiconductor device.

The other purposes and the new feature of the present invention will become clear from the description of the present specification and the accompanying drawings.

Among embodiments of the present invention disclosed herein, a brief description is given to one representative embodiment as follows.

This embodiment is a semiconductor device, including a quadrangular semiconductor chip mounted thereon having a principal surface in which a plurality of bonding pads, each in a rectangular shape sectioned into a bonding region and a probe region, is disposed and a back surface opposing the principal surface. The semiconductor chip has a protective film in an upper layer of each of the bonding pads, and the protective film covers a periphery of each of the bonding pads and is opened to expose an upper face of each of the bonding pads. Further, an overlapping width of the protective film and the periphery of each bonding pad in the bonding region is wider than an overlapping width of the protective film and the periphery of each bonding pad in the probe region.

This embodiment is also a semiconductor device, including a quadrangular semiconductor chip mounted thereon having a principal surface in which a plurality of bonding pads in a convex shape sectioned into a bonding region and a probe region is disposed thereon and a back surface opposing the principal surface. The semiconductor chip has a protective film in an upper layer of each of the bonding pads, and the protective film covers a periphery of each of the bonding pads and is opened to expose an upper face of each of the bonding pads. Further, an overlapping width of the protective film and the periphery of each bonding pad in the bonding region is wider than an overlapping width of the protective film and the periphery of each bonding pad in the probe region, and the respective bonding pads are staggered alternately with each other along sides of the semiconductor chip in a longitudinal direction of the bonding pad and are disposed with the convex shape alternately in reverse.

This embodiment is also a semiconductor device, including a semiconductor chip mounted thereon having a quadrangular power source bonding pad sectioned into a bonding region and a probe region. The power source bonding pad has an upper face with a part exposed across the bonding region and the probe region by two openings in a protective film formed in an upper layer of the power source bonding pad, the bonding region and the probe region of the power source bonding pad are exposed from the two openings respectively, and the power source bonding pad has a slit only in the bonding region between the two openings. The protective film is formed by covering a periphery of the power source bonding pad, and the two openings are formed in such a manner that an overlapping width of the protective film and the periphery of each bonding pad in the bonding region is wider than an overlapping width of the protective film and the periphery of each bonding pad in the probe region.

Among the inventions disclosed in the present application, effects obtained by an embodiment of the representative invention will be briefly described below.

It is possible to prevent cracking in a protective film of the uppermost layer of a semiconductor device and improve the reliability of the semiconductor device.

DETAILED DESCRIPTION OF THE PREFERRED EMBODIMENTS

Figure 1:
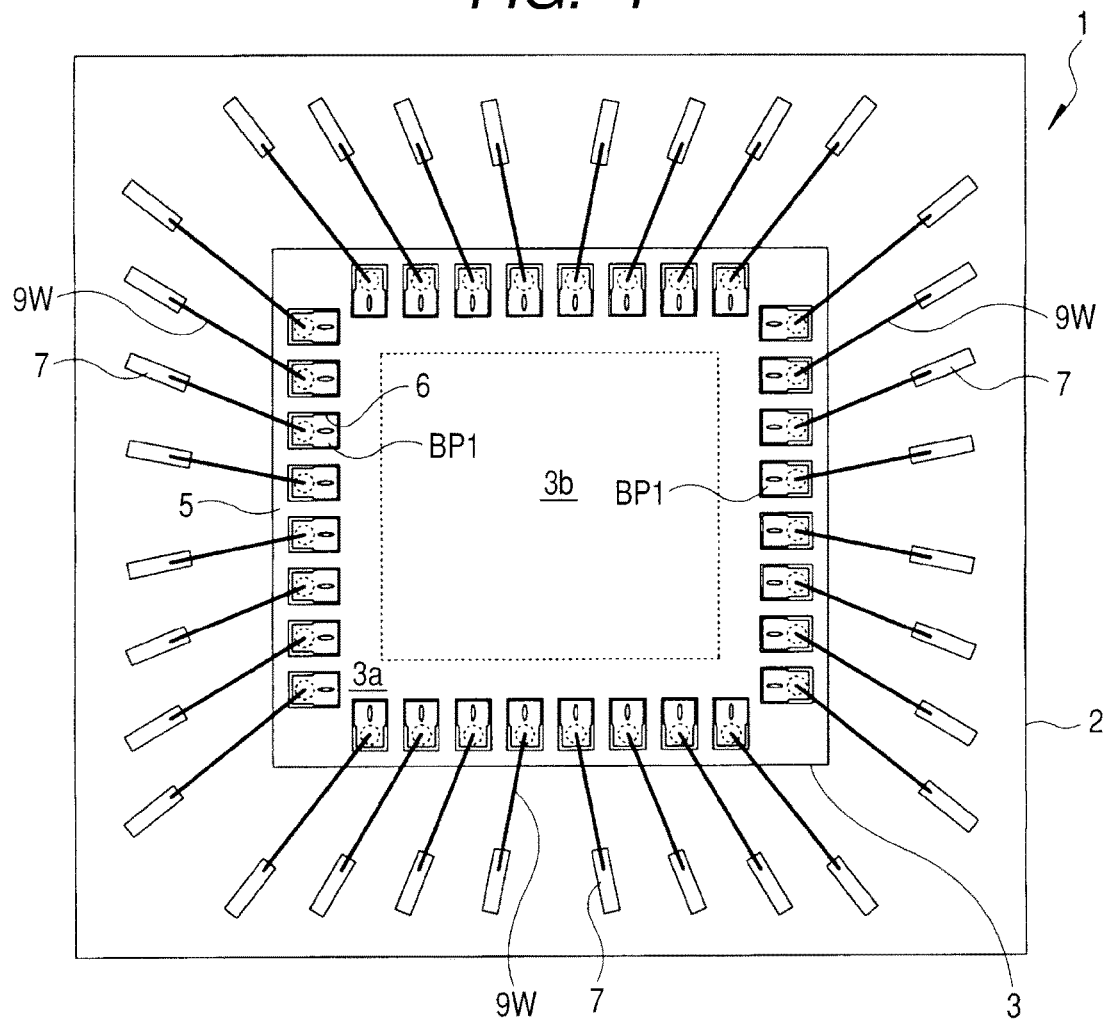
FIG. 1 is a plan view illustrating a configuration of a BGA semiconductor device that employs wire bonding connection according to a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the embodiments below, when mentioning the shapes or the positional relationship, for example, of components and the like, the embodiments are considered to include those substantially close or similar to the shapes or the like unless, for example, otherwise specified or considered not to work apparently in principle. These are similar with the numerical values and the ranges.

In the drawings used in the embodiments below, even a plan view may be hatched for better visualization of the drawings. In the embodiments below, although a wafer mainly refers to a single crystal Si (silicon) wafer, it is not limited to this but also refers to an SOI (silicon on insulator) wafer, an insulating film substrate to form an integrated circuit thereon, and the like. The shape is not only in a circle or roughly in a circle but also includes a square shape, a rectangular shape, and the like.

In addition, in all of the drawings for illustration of the embodiments below, an identical reference numeral or character is basically assigned to those having an identical function to omit repetitive descriptions for them. A detailed description is given below to the embodiments of the present invention based on the drawings.

(First Embodiment)

Figure 2:
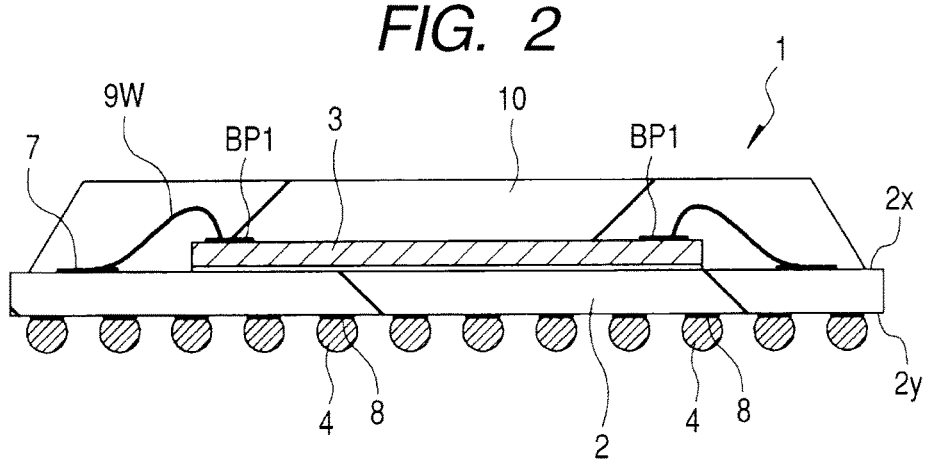
FIG. 2 is a cross-sectional view illustrating the configuration of the BGA semiconductor device that employs wire bonding connection according to the first embodiment.
Figure 3:
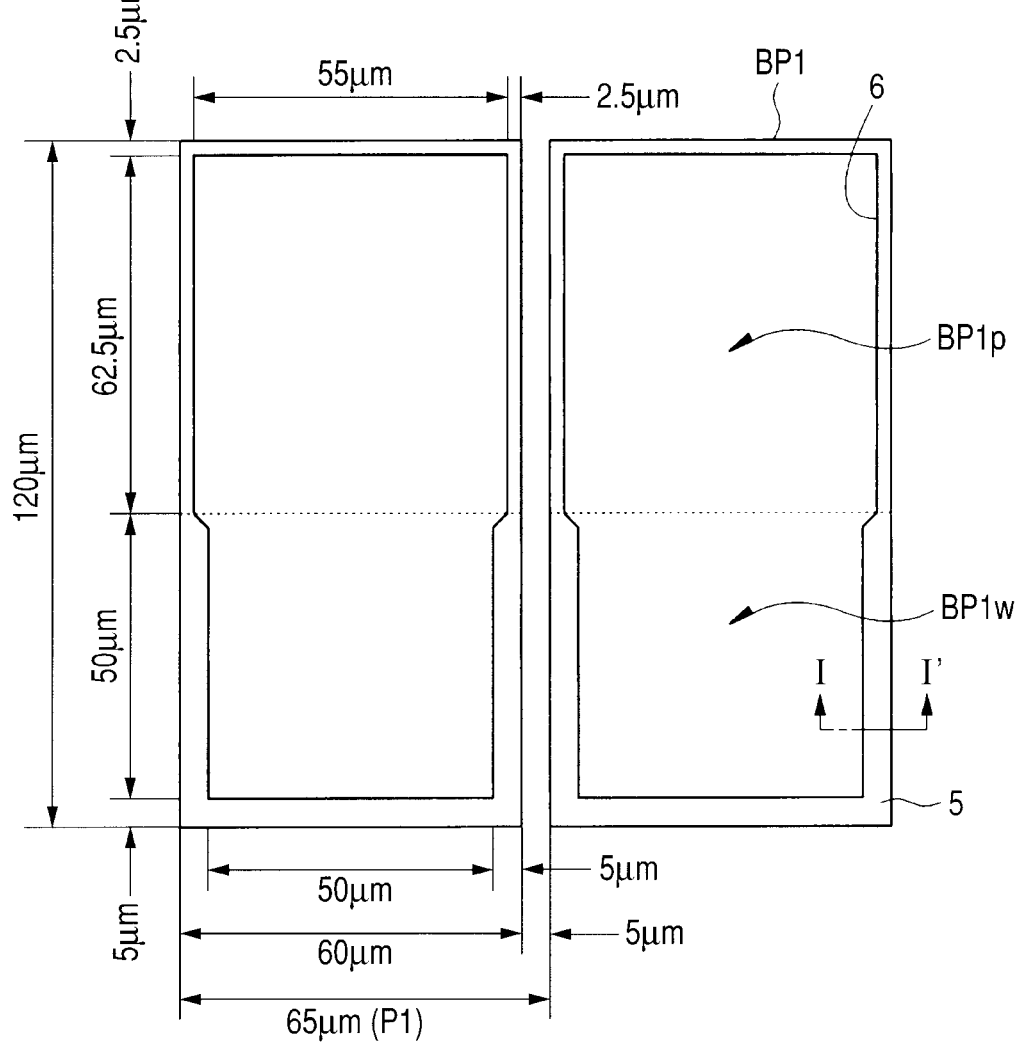
FIG. 3 is an enlarged plan view illustrating a major portion of bonding pads according to the first embodiment.
Figure 4:
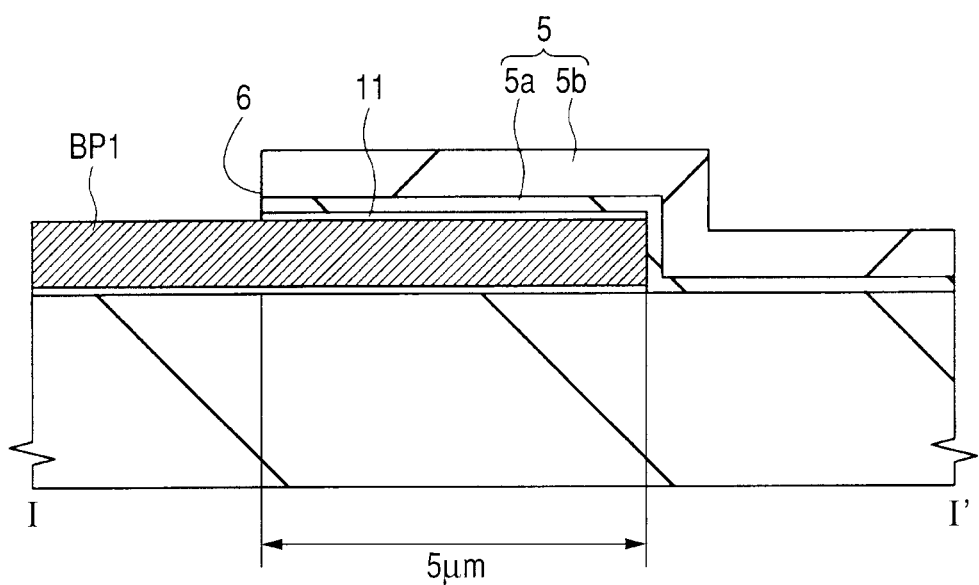
FIG. 4 is a partially enlarged cross-sectional view (cross-sectional view taken along a line I-I' in FIG. 3) illustrating a major portion of the bonding pad according to the first embodiment.

A description is given to a BGA (ball grid array) semiconductor device of a face up bonding structure that employs wire bonding connection according to a first embodiment using FIGS. 1 through 4. FIG. 1 is a plan view illustrating a configuration of a BGA semiconductor device that employs wire bonding connection, FIG. 2 is a cross-sectional view illustrating the configuration of the BGA semiconductor device that employs wire bonding connection, FIG. 3 is an enlarged plan view illustrating a major portion of bonding pads, and FIG. 4 is a partially enlarged cross-sectional view (cross-sectional view taken along a line I-I' in FIG. 3) illustrating a major portion of the bonding pad.

As illustrated in FIGS. 1 and 2, a semiconductor device 1 has a package structure in which, out of a principal surface 2x and a back surface 2y of a wiring substrate 2 positioned opposing to each other, a semiconductor chip 3 is mounted over the principal surface 2x and a plurality of solder balls 4 is disposed over the back surface 2y of the wiring substrate as connection terminals for the outside, though the structure is not limited to this.

The semiconductor chip 3 is mounted over the principal surface 2x of the wiring substrate 2 via an adhesive in paste form or in a film shape, such as a DAF (die attach film), and the semiconductor chip 3 has a quadrangular shape on a plane intersecting a direction of the thickness. One row of a plurality of bonding pads BP1 is disposed along each side (periphery) of the principal surface of the semiconductor chip 3. A core region 3b is formed in an inner side of a region (pad region) 3a in which the bonding pads BP1 are provided, and integrated circuits, such as a CPU (central processing unit), a DSP (digital signal processing), a RAM (random access memory), a PLL (phase locked loop), and a DLL (delay locked loop), are formed therein.

The bonding pads BP1 are formed of wiring in the uppermost layer among a multilayer wiring layer (multilayer wiring layer in which a plurality of insulating films and a plurality of wiring layers are stacked each) of the semiconductor chip 3. A protective film 5 is formed in an upper layer of each of the bonding pads BP1 so as to cover the multilayer wiring layer, and a part of an upper face of each bonding pad BP1 is exposed by an opening 6 formed in the protective film 5.

The wiring substrate 2 is, for example, a build up substrate and has a quadrangular shape on a plane intersecting a direction of the thickness. The wiring substrate 2 is mainly configured to have a core material, a principal surface protective film formed so as to cover the principal surface of the core material, and a back surface protective film formed so as to cover a back surface positioned in opposite side of the principal surface of the core material. The core material has, for example, a multilayer wiring structure having wirings in the principal surface, the back surface, and the inside.

One row of a plurality of bonding leads 7 is disposed in a region between peripheral ends of the semiconductor chip 3 and peripheral ends of the wiring substrate 2 along each side of the wiring substrate 2 over the principal surface 2x of the wiring substrate 2. The bonding leads 7 are formed of wirings of the uppermost layer formed in the core material of the wiring substrate 2, and each bonding lead 7 has an upper face exposed by an opening formed in the principal surface protective film. A plurality of back surface electrode pads 8 is disposed over the back surface 2y of the wiring substrate 2. The back surface electrode pads 8 are formed of wirings of the lowermost layer formed in the core material of the wiring substrate 2, and a lower face of each back surface electrode pad 8 is exposed by an opening formed in the back surface protective film. The wirings of the uppermost layer formed in the core material are electrically coupled respectively to the wirings of the lowermost layer by wirings formed inside a plurality of through holes that penetrate the core material.

The bonding pads BP1 disposed over the principal surface of the semiconductor chip 3 are electrically coupled respectively to the bonding leads 7 disposed over the principal surface of the wiring substrate 2 by a plurality of bonding wires 9W. A gold wire of approximately 20 to 30 μmϕ, for example, is used for the bonding wires 9W. For the wire bonding connection, a nail head bonding (ball bonding) technique, for example, can be used in which ultrasonic vibration is used together with thermocompression. The semiconductor chip 3 and the bonding wires 9W are sealed by a resin sealing material 10 formed over the principal surface of the wiring substrate 2. The resin sealing material 10 contains, for example, an insulating resin, such as epoxy.

As illustrated in FIG. 3, each bonding pad BP1 is in a rectangular shape and has shorter sides in a direction along the respective side of the semiconductor chip and longer sides in a direction intersecting the side of the semiconductor chip 3. In addition, a surface region of one bonding pad BP1 is separated along the longer sides (longitudinally) into a region to join the respective bonding wire (wire bonding region) BP1w and a region to be made contact with an inspection probe (probe region) BP1p. Here, regarding the disposition of the wire bonding region BP1w and the probe region BP1p, each bonding pad BP1 is desirably disposed in such a manner that the wire bonding region BP1w is closer to the respective side of the semiconductor chip. By disposing the wire bonding region BP1w closer to the side of the semiconductor chip, a length of the respective bonding wire that electrically couples the bonding pad BP1 with the respective bonding lead 7 formed over the principal surface of the wiring substrate can be made shorter and the inductance between the bonding pad BP1 and the bonding lead 7 can be made smaller than a case of the probe region BP1p being disposed closer to the side of the semiconductor chip.

The bonding pad BP1 is formed of a metal film containing, for example, an aluminum film as a main material, and has a thickness of approximately 0.85 μm, for example. In a case that a pitch P1 with the adjacent bonding pad BP1 disposed along the side of the semiconductor chip is 65 μm, for example, the dimensions of the bonding pad BP1 can be illustrated as an example in such a manner that, for example, one longitudinal side is 120 μm, one transverse side is 60 μm, and a distance between the adjacent bonding pads BP1 is 5 μm.

Since the bonding pad BP1 may be provided with an approximate width that does not cause the wire bonding region BP1w and the probe region BP1p to overlap, the area of the probe region BP1p and the area of the wire bonding region BP1w may be same. However, in the first embodiment, the dimension of the probe region BP1p is set to be longer than the dimension of the wire bonding region BP1w in a longitudinal direction of the bonding pad BP1 in order to widen the probe region BP1p. For example, as illustrated in FIG. 3, the dimension of the wire bonding region BP1w longitudinally in the bonding pad BP1 is, for example, 50 μm and the dimension of the probe region BP1p longitudinally in the bonding pad BP1 is, for example, 62.5 μm.

Each bonding pad BP1 is formed of wiring of the uppermost layer in the multilayer wiring layer of the semiconductor chip and is exposed by each opening 6 formed in correspondence with the respective bonding pad BP1 in the protective film 5 that is formed so as to cover the multilayer wiring layer.

As illustrated in FIG. 4, the protective film 5 is formed over each bonding pad BP1, and is formed of a laminated film of, for example, a silicon oxide film 5a and a silicon nitride film 5b deposited thereon. The silicon oxide film 5a is formed by, for example, plasma CVD (chemical vapor deposition) method and has a thickness of approximately 0.2 μm, for example. The silicon nitride film 5b is formed by plasma CVD method, for example, and has a thickness of approximately 0.6 μm, for example. The silicon nitride film 5b formed by plasma CVD method has a function of preventing the entrance of moisture from outside.

An antireflection film 11 remains between the upper face of the bonding pad BP1 and the protective film 5. The antireflection film 11 is a film provided to prevent halation during a photolithography process when forming the bonding pad BP1 by photolithography and etching. That is, after forming a metal film (an aluminum film, for example) and the antireflection film over the entire faces of a wafer, the bonding pad BP1 is formed by processing the metal film and the antireflection film by photolithography and etching (and the wiring of the uppermost layer is also formed at the same time). Subsequently, after forming the protective film 5 over the entire faces of the wafer, the opening 6 is formed in the protective film 5 that exposes the upper face of the bonding pad BP1 by photolithography and etching. At this point, the antireflection film 11 beneath the protective film 5 is not removed, so that the antireflection film 11 remains between the upper face of the bonding pad BP1 and the protective film 5. The antireflection film 11 is formed of, for example, a titanium nitride film and has a thickness of approximately 0.075 μm, for example.

The opening 6 formed in the protective film 5 is provided over the bonding pad BP1. This is because the bonding pad BP1 is used as a stopper film for etching the protective film 5 when forming the opening 6 in the protective film 5 formed over the bonding pad BP1. Accordingly, the protective film 5 overlaps over the periphery of the bonding pad BP1 by a predetermined width, and the periphery of the bonding pad BP1 is covered with the protective film 5.

In each of the bonding pads BP1 according to the first embodiment, the width of the protective film 5 overlapping the periphery of the bonding pad BP1 varies in the wire bonding region BP1w and in the probe region BP1p, and the opening 6 in a convex shape is formed in such a manner that the width of the protective film 5 overlapping in the wire bonding region BP1w is wider than the width of the protective film 5 overlapping in the probe region BP1p. The overlapping widths of the protective film 5 can be illustrated as an example in the wire bonding region BP1w as, for example, 5 μm and in the probe region BP1p, for example, 2.5 μm. Accordingly, the dimensions of the opening 6 transversely in the wire bonding region BP1w is, for example, 50 μm and transversely in the probe region BP1p is, for example, 55 μm.

In a case of the bonding pad BP1 with the dimensions above, for the bonding wire with a diameter of, for example, 30 μm, the diameter of the metal ball at the tip end thereof becomes approximately 40 μm, for example, and as long as the metal ball joins only at the center of the wire bonding region BP1w, the metal ball does not run over the portion where the periphery of the bonding pad BP1 and the protective film 5 overlap. However, in an actual wire bonding process, it is difficult to carry out wire bonding in such a manner that the metal ball does not run over the portion where the periphery of the bonding pad BP1 and the protective film 5 overlap.

An explanation is given to the reason. The wire bonding apparatus used in a wire bonding process carries out wire bonding by using ultrasonic vibration together with thermo-compression. The wire bonding apparatus connects the bonding pads provided in the semiconductor chip and the corresponding bonding leads provided in the wiring substrate with the bonding wires. In the step of connecting wires, firstly a capillary is lowered over the wire bonding region of a predetermined bonding pad to pressure-bond a metal ball at the tip end of the bonding wire. At this point, while applying heat at, for example, approximately 230° C., ultrasonic vibration is used together. The load is, for example, approximately 120 mN. Subsequently, the capillary is raised up to a predetermined height to shift the capillary to a corresponding bonding lead in a loop. The bonding wire is slightly collapsed by pressurizing the capillary over the bonding lead, and the bonding wire is split from the capillary by a raise. These are sequentially performed for wire bonding regions of the bonding pads disposed in a row and respective bonding leads corresponding to the wire bonding regions. The time period for connecting the wire bonding region of one of the bonding pads and one of the bonding leads with the bonding wire is generally as fast as, for example, 0.1 second or less. In the step of connecting the wires by the wire bonding apparatus, there are various factors to cause the metal balls to go off from the center of the wire bonding region.

In order to automatically carry out the step of connecting the wires, positional coordinates of the bonding pads of the semiconductor chip and the bonding leads of the wiring substrate are input in advance to the wire bonding apparatus and the apparatus holds the data inside. Although the positional coordinates are input generally using a camera provided in the wire bonding apparatus by image recognition, a person determines whether the input image is good or not and operates the wire bonding apparatus, so that occurrence of recognition errors is inevitable. The semiconductor chip and the wiring substrate subjected to bonding are set over an XYθ table provided in a base platform of the wire bonding apparatus, and since the XYθ table repeats fast movements in a large number of times while bonding, errors in movement stop of the XYθ table also occurs. Although the metal balls are collapsed by the load and the ultrasonic waves applied via the capillary, the diameters of the ball after the collapse also have variations in the order of several μm. Further, as semiconductor chips become smaller in size for the trend of downsizing of semiconductor devices in recent years, bonding pads also become smaller in size with the trend, so that the clearance between the edges of such a bonding pad and the circumference of such a metal ball is left only by several μm approximately.

That is to say, many of the metal balls turn out to run over the portions where the periphery of the respective bonding pad overlaps the protective film due to built up factors of the image recognition errors, the errors in movement stop of the XYθ table, the variations in the ball diameters, the reduction in the clearance between edges of the bonding pad and the outer circumference of the respective metal ball, and others.

However, by securing a wider width of overlapping the periphery of the bonding pad BP1 and the protective film 5 in the wire bonding region BP1w as, for example, 5 μm as in the first embodiment, the strength in the portion where the periphery of the bonding pad BP1 and the protective film 5 overlap is improved and thus it is possible to prevent cracking in the protective film 5 even when the metal ball runs over the overlapping portion. To the extent that an alloy layer is formed well between the metal ball and the bonding pad BP1 and no problem of joint occurs, the overlapping width of the periphery of the bonding pad BP1 and the protective film 5 in the wire bonding region BP1w may also be widened even more by making the metal ball smaller. This enables to further decrease the risk of cracking in the protective film 5. From a result of a review by the present inventors, it is confirmed that, as long as the overlapping width of the periphery of the bonding pad BP1 and the protective film 5 is 5 μm, the protective film 5 does not crack even when the metal ball runs over the portion where the periphery of the bonding pad BP1 and the protective film 5 overlap.

On the other hand, as long as a probe makes contact only with the center of the probe region BP1p during the process of semiconductor chip inspection, the probe does not make contact with the portion where the periphery of the bonding pad BP1 and the protective film 5 overlap even when the area of the opening 6 in which the bonding pad BP1 in the probe region BP1p exposes is smaller. However, in an actual process of semiconductor chip inspection, it is difficult to make a probe contact only with the center of the probe region BP1p.

An explanation is given to the reason. For example, a semiconductor chip is inspected by a tester in the stage of a wafer before separated into individual pieces by dicing. A probe card is used to couple the tester to the semiconductor chip for the inspection. The probe card has one face provided with a plurality of probes, and they make contact respectively with probe regions of the bonding pads provided in the semiconductor chip. Then, electrical characteristics of an integrated circuit formed over the principal surface of the semiconductor chip are measured by the tester via the probes. The inspection is carried out to a plurality of semiconductor chips (for example, semiconductor chips aligned in 4×8) at the same time, and probes of 1000 to 2000 may make contact with the respective bonding pads at a time. Therefore, the probes often go off from the center of the probe regions of the bonding pads, and in a case of considering the amount of misalignment, the area of openings in which the bonding pads of the probe regions are exposed cannot be made smaller.

However, it is possible to secure the area of each opening 6 widely in which the upper face of each bonding pad BP1 is exposed by determining an overlapping width of the periphery of the bonding pad BP1 and the protective film 5 in the probe region BP1p to be narrow, for example, 2.5 μm as in the first embodiment. When the overlapping width of the periphery of the bonding pad BP1 and the protective film 5 in the probe region BP1p is narrowed even more, the risk of the probe making contact with the protective film 5 at the periphery of the bonding pad BP1 also becomes low. However, in this case, there is a possibility that, due to the misalignment between the bonding pad BP1 and the opening 6 when forming the opening 6 in the protective film 5, the interlayer insulating film in the periphery of the bonding pad BP1 that is formed in a layer lower than the bonding pad BP1 may also be etched at the same time of etching the protective film 5. From a result of a review by the present inventors, it is confirmed that the process failure does not occur as long as the overlapping width of the periphery of the bonding pad BP1 and the protective film 5 is 2.5 μm.

As just described, according to the first embodiment, the bonding pads BP1 are formed in a rectangular shape, and the opening 6 is formed in the protective film 5 over each bonding pad BP1 in such a manner that the overlapping width of the protective film 5 in the wire bonding region BP1w with the bonding pad BP1 becomes wider than the overlapping width of the protective film 5 in the probe region BP1p with the bonding pad BP1. This enables to prevent cracking in the protective film 5 in the wire bonding region BP1w of the bonding pad BP1 even when the metal ball runs over the periphery of the bonding pad BP1 while joining the metal ball with the wire bonding region BP1w. In addition, the opening 6 exposing the bonding pad BP1 in the probe region BP1p of the bonding pad BP1 may be as wide as the probe does not make contact with the protective film 5 that overlaps the periphery of the bonding pad BP1. The former enables to prevent moisture from entering into the bonding pads BP1 via cracks, as cracks are not generated, and prevent electrical failures, such as a short-circuit between the bonding pads BP1, a short-circuit between the inner wirings, or a short-circuit between the bonding pads BP1 and the inner wirings. The latter enables to prevent breakage of the protective film 5 due to a contact of the probe with the protective film 5.

Although the above descriptions are given to a case of applying the present invention to a BGA semiconductor device that employs wire bonding connection, the present invention is not limited to them. For example, the present invention can also be applied to a semiconductor device that employs flip chip connection in which a semiconductor chip and a wiring substrate are connected via bump electrodes.

Figure 5A:
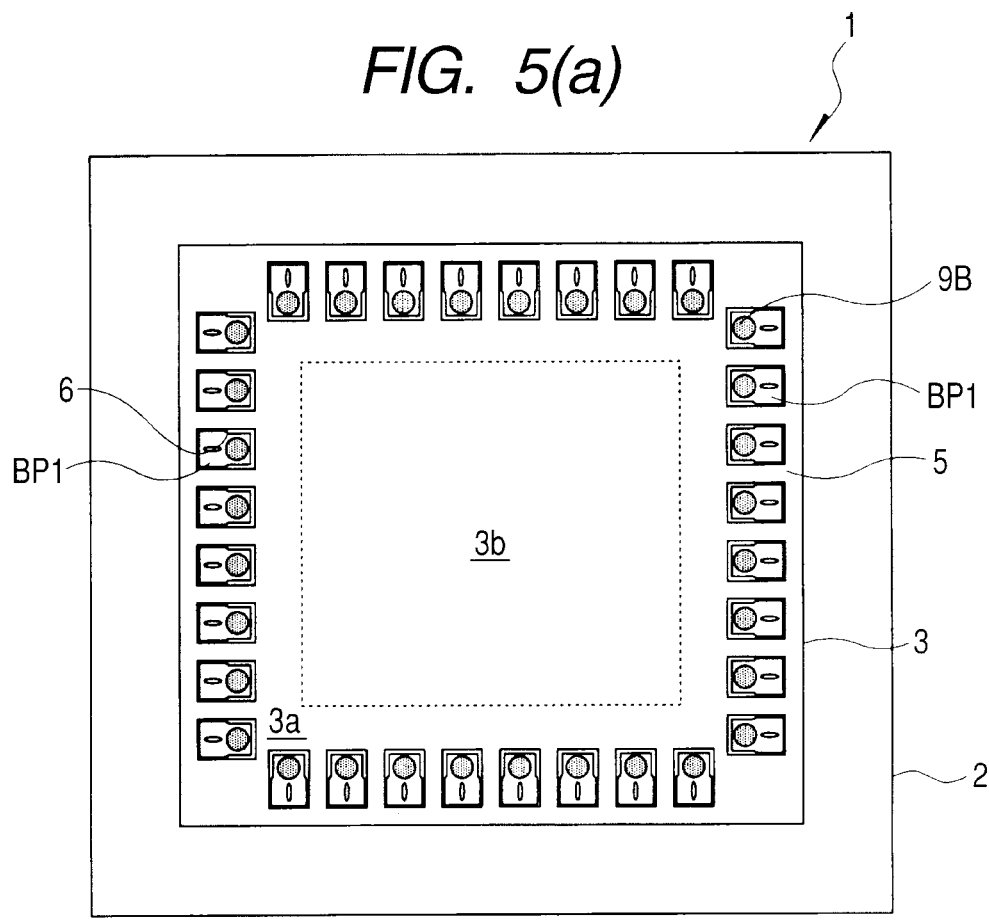
FIGS. 5A and 5B are a plan view and a partially enlarged cross-sectional view, respectively, illustrating a configuration of a BGA semiconductor device that employs flip chip connection according to the first embodiment.
Figure 5B:
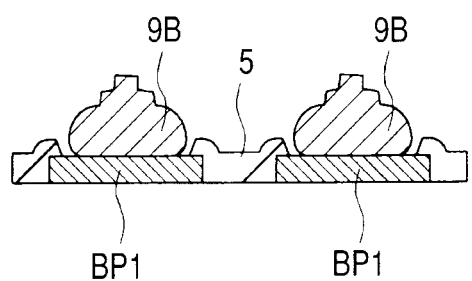
Figure 6:
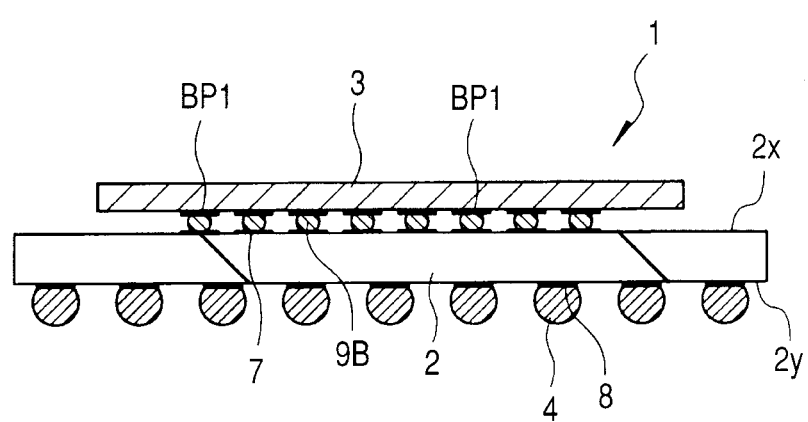
FIG. 6 is a cross-sectional view illustrating the configuration of the BGA semiconductor device that employs flip chip connection according to the first embodiment.

A description is given to a BGA semiconductor device of a face down bonding structure that employs flip chip connection using FIGS. 5A, 5B and 6. FIGS. 5A and 5B are a plan view and a partially enlarged cross-sectional view, respectively, illustrating a configuration of a BGA semiconductor device that employs flip chip connection, and FIG. 6 is a cross-sectional view illustrating the configuration of the BGA semiconductor device that employs flip chip connection. Although a principal surface of a semiconductor chip with bonding pads formed thereon is illustrated in FIGS. 5A and 5B to describe the disposition of the bonding pads, the principal surface of the semiconductor chip actually faces a principal surface of a wiring substrate as illustrated in FIG. 6.

As illustrated in FIGS. 5A, 5B, and 6, the shapes of bonding pads BP1 and openings 6 are same as those described above using FIGS. 3 and 4. That is, each of the bonding pads BP1 is in a rectangular shape and has shorter sides in a direction along the respective side of the semiconductor chip 3 and longer sides in a direction intersecting the side of the semiconductor chip 3. In addition, a surface region of one bonding pad BP1 is separated longitudinally into a bump bonding region connected to bumps 9B (region same as the wire bonding region BP1w illustrated in FIG. 3) and a probe region (region same as the probe region BP1p illustrated in FIG. 3). The width of the protective film 5 overlapping the periphery of the bonding pad BP1 varies in the bump bonding region and in the probe region, and an opening 6 in a convex shape is formed in such a manner that the overlapping width of the protective film 5 in the bump bonding region is wider than the overlapping width of the protective film 5 in the probe region.

In a case of a face down bonding structure that employs such flip chip connection, each bonding pad BP1 may be disposed in such a manner that the bump bonding region is closer to the core region 3b than to the respective side of the semiconductor chip 3 (in such a manner that the probe region is closer to the side than to the core region 3b of the semiconductor chip 3). By disposing the bump bonding region closer to the core region 3b of the semiconductor chip 3, a length of the respective circuit wiring that electrically couples the bonding pad BP1 with the integrated circuit formed in the core region 3b can be made shorter and the inductance derived from the circuit wiring can be made smaller than a case of the probe region being disposed closer to the core region 3b of the semiconductor chip 3.

Although the characteristics described in the first embodiment is exemplified with a case applied to a BGA package, the present embodiment is not limited to this but is applicable to other packages, such as a QFP (quad flat package), an SOP (small outline package), and a CSP (chip size package).

(Second Embodiment)

Figure 7:
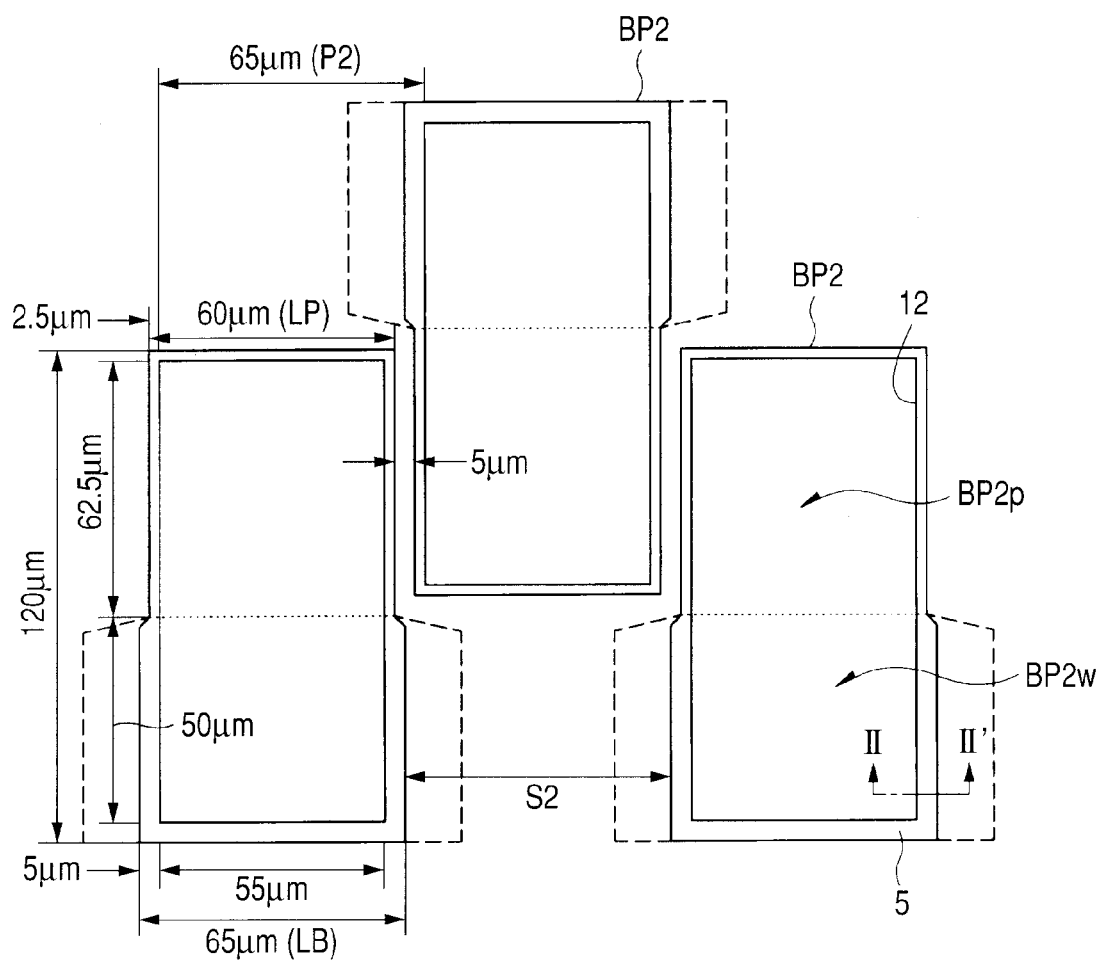
FIG. 7 is an enlarged plan view illustrating a major portion of bonding pads according to a second embodiment.

A second embodiment is a modification of the bonding pad BP1 according to the first embodiment and is different in the shapes of bonding pads and openings and the disposition of the bonding pads from those described in the first embodiment. A description is given to the shape and the disposition of the bonding pads according to the second embodiment using FIGS. 7 and 8. FIG. 7 is an enlarged plan view illustrating a major portion of bonding pads, and FIG. 8 is a partially enlarged cross-sectional view (cross-sectional view taken along a line II-II' in FIG. 7) illustrating a major portion of the bonding pad.

Figure 8:
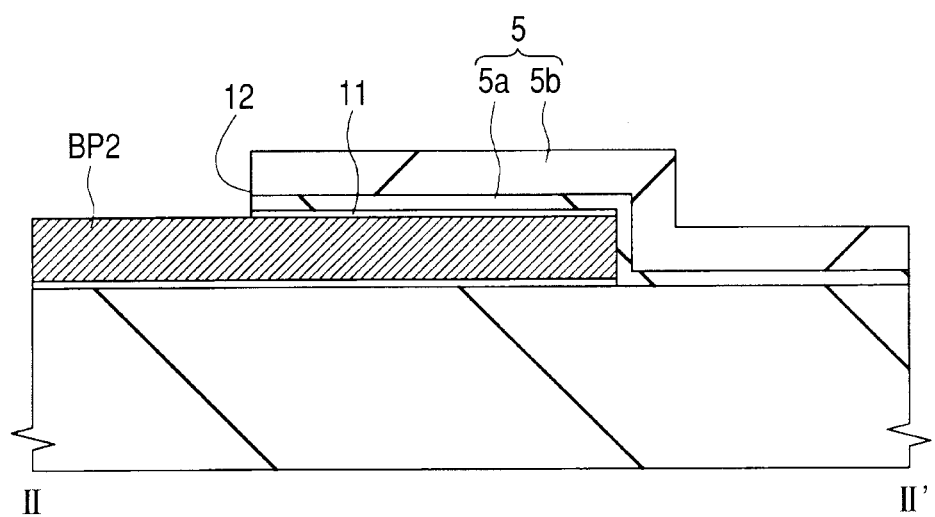
FIG. 8 is a partially enlarged cross-sectional view (cross-sectional view taken along a line II-II' in FIG. 7) illustrating a major portion of the bonding pad according to the second embodiment.

As illustrated in FIGS. 7 and 8, similar to the first embodiment, a surface region of one bonding pad BP2 is separated into a wire bonding region BP2w and a probe region BP2p. However, different from the first embodiment, a length (LB) along the respective side of the semiconductor chip in the wire bonding region BP2w is formed longer than a length (LP) along the side of the semiconductor chip in the probe region BP2p, and the bonding pad BP2 has a convex shape. Further, each of the bonding pads BP2 is disposed alternately with each other (in zigzag) staggeredly along the side of the semiconductor chip in a longitudinal direction of the bonding pad BP2 and is disposed with the convex shape alternately in reverse in such a manner that the wire bonding region BP2w is close to the side of the semiconductor chip, to the core region, to the side of the semiconductor chip, and the like.

The dimension of the bonding pad BP2 in a direction of intersecting the side of the semiconductor chip (longitudinally) can be same as that of the bonding pad BP1 according to the first embodiment, and the dimensions of the bonding pad BP2 can be illustrated in such a manner that, for example, one longitudinal side is 120 µm, the longitudinal dimension of the bonding pad BP2 in the wire bonding region BP2w is, for example, 50 µm, and the longitudinal dimension of the bonding pad BP2 in the probe region BP2p is, for example, 62.5 µm.

Similar to the first embodiment, in a case that a pitch P2 between the adjacent bonding pads BP2 disposed in zigzag along the side of the semiconductor chip 3 is, for example, 65 µm and a minimum distance between the adjacent bonding pads BP2 is, for example, 5 µm, the dimensions of the bonding pad BP2 along the side (transversely) of the semiconductor chip 3 can be, for example, the transverse dimension of the wire bonding region BP2w is 65 µm and the transverse dimension of the probe region BP2p is 60 µm. Since the distance S2 between the wire bonding regions BP2w in the bonding pads BP2 disposed alternately may be at least 5 µm, which is the minimum distance, the transverse dimension of the wire bonding region BP2w can be larger than 65 µm mentioned above as illustrated in broken lines in FIG. 7.

Similar to the first embodiment, each bonding pad BP2 is exposed by an opening 12 formed in correspondence with the respective bonding pad BP2 in the protective film 5 that is formed of wiring of the uppermost layer among a multi-layer wiring layer of the semiconductor chip and formed so as to cover the multilayer wiring layer. The opening 12 in the protective film 5 is provided over the bonding pad BP2, and the protective film 5 overlaps a periphery of the bonding pad BP2 by a predetermined width and thus the periphery of the bonding pad BP2 is covered with the protective film 5.

However, different from the first embodiment, the bonding pad BP2 according to the second embodiment has the opening 12 in a rectangular shape. Accordingly, the width of the protective film 5 overlapping the periphery of the bonding pad BP2 varies in the wire bonding region BP2w and in the probe region BP2p, and the width of the protective film 5 overlapping in the wire bonding region BP2w becomes wider than the width of the protective film 5 overlapping in the probe region BP2p. The dimensions of the opening 12 can be illustrated as an example in such a manner that, for example, one longitudinal side is 112.5 µm and one transverse side is 55 µm. In accordance with the dimensions of the bonding pad BP2 and the opening 12, the width of the protective film 5 overlapping in the wire bonding region BP2w can be 5 µm and the width of the protective film 5 overlapping in the probe region BP2p can be 2.5 µm. In a case that the transverse dimension of the bonding pad BP2 in the wire bonding region BP2w is larger than 65 µm, the width of the protective film 5 overlapping in the wire bonding region BP2w can be enlarged. For example, in a case that the transverse dimension of the bonding pad BP2 in the wire bonding region BP2w is 125 µm, an overlapping width of 35 µm is obtained for the protective film 5 in the wire bonding region BP2w.

As just described, according to the second embodiment, each bonding pad BP2 is in a convex shape having a length along the side of the semiconductor chip in the wire bonding region BP2w formed longer than the length along the side of the semiconductor chip in the probe region BP2p and the opening 12 formed in the protective film 5 over the bonding pad BP2 is in a rectangular shape, and thereby the width of the protective film 5 overlapping in the wire bonding region BP2w of the bonding pad BP2 can be wider than the width of the protective film 5 overlapping in the probe region BP2p of the bonding pad BP2. This enables to prevent cracking in the protective film 5 even when the metal ball at the tip end of the bonding wire runs over the periphery of the bonding pad BP2 in the wire bonding region BP2w of the bonding pad BP2 after securing a width of the opening 12 in such a manner that the probe does not make contact with the protective film 5 running over the periphery of the bonding pad BP2 in the probe region BP2p of the bonding pad BP2, so that it is possible to obtain effects similar to those of the first embodiment.

Further, each of the bonding pads BP2 is disposed alternately with each other (in zigzag) staggeredly along the respective side of the semiconductor chip in a longitudinal direction of the bonding pad BP2 and is disposed with the convex shape alternately in reverse in such a manner that the wire bonding region BP2w is close to the side of the semiconductor chip, to the core region, to the side of the semiconductor chip, and the like.

With such a disposition, a space is secured corresponding to the transverse dimension (width) of approximately one piece of the probe region BP2p between the wire bonding regions BP2w of the respective bonding pads BP2. The transverse dimension in the wire bonding region BP2w can be enlarged in the secured space, and in association with that, the overlapping width of the protective film 5 can be enlarged, so that the crack resistance can be more improved.

(Third Embodiment)

In recent years, as illustrated in FIG. 2 above, halogen free members are increasingly used for the resin member (resin material) constituting the resin sealing material 10 to seal the wiring substrate 2 with the semiconductor chip 3 mounted thereon or the semiconductor chip 3 from the perspective of environmental protection and a reduction of materials causing environmental load. Specifically, collection and recovery of wastes of electrical and electronic equipment are defined, and further plastics containing bromine-based flame retardants are defined as substances to be excluded from the separately recovered wastes by a WEEE (waste electrical and electronic equipment) directive. This results in an increasing request to use a halogen free member for the wiring substrate 2 or the resin member (resin material) constituting the resin sealing material 10. The halogen free member used for the wiring substrate 2 is a material with a chlorine content of 0.09 weight % or less, a bromine content of 0.09 weight % or less, and a total amount of chlorine and bromine as 0.15 weight % or less. The halogen free member used for the resin member (resin material) constituting the resin sealing material 10 is a material with a chlorine content of 0.09 weight % or less, a bromine content of 0.09 weight % or less, and an antimony content of 0.09 weight % or less. That is to say, a case of using such a halogen free member for the wiring substrate 2 and the resin member (resin material) constituting the resin sealing material 10 means that the materials defined by the WEEE directive is used.

However, it is found that, when using such a halogen free member for a package material, the adhesion (adherence) between, for example, the surface of the semiconductor chip and the resin member (resin material) decreases compared with conventional package materials, resulting in moisture entering inside the package, and thereby the moisture resistance of the semiconductor device may be decreased.

The third embodiment described below relates to a bonding pad that has effects of preventing crack generation in the protective film and also, even in a case of using a halogen free member, being capable of securing the moisture resistance of the semiconductor device.

Figure 9:
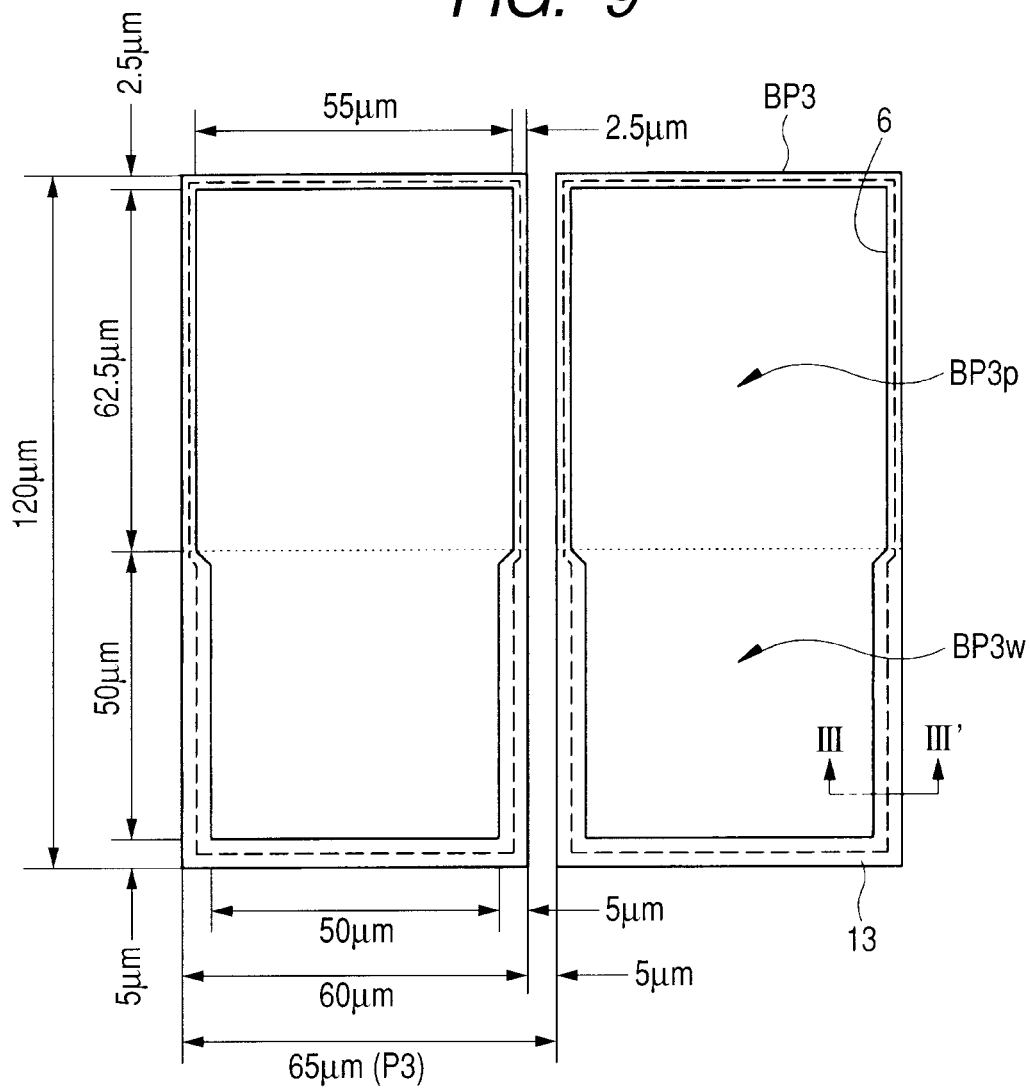
FIG. 9 is an enlarged plan view illustrating a major portion of bonding pads according to a third embodiment.
Figure 10:
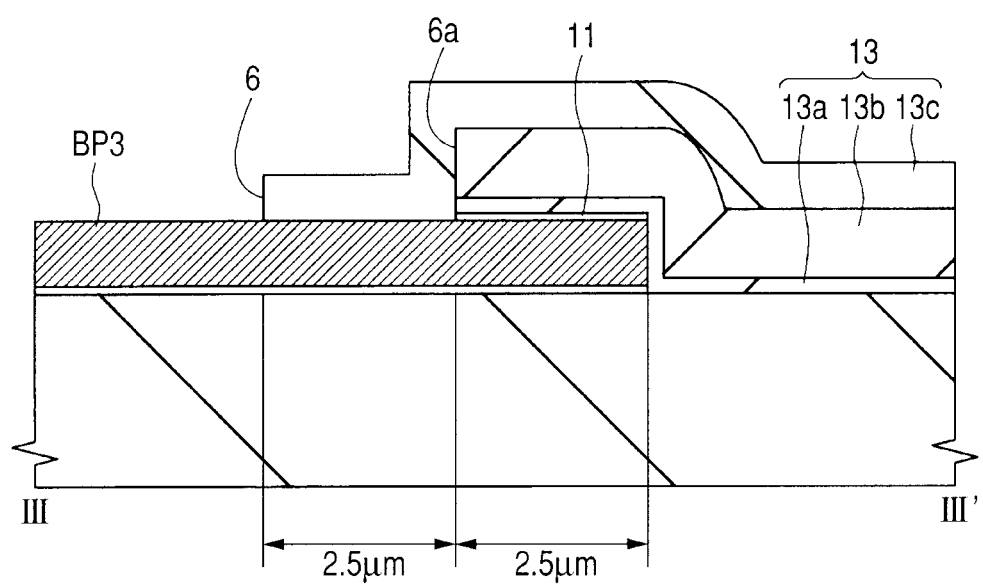
FIG. 10 is a partially enlarged cross-sectional view (cross-sectional view taken along a line III-III' in FIG. 9) illustrating a major portion of the bonding pad according to the third embodiment.

A description is given to the shape of the bonding pad according to the third embodiment using FIGS. 9 and 10. FIG. 9 is an enlarged plan view illustrating a major portion of bonding pads, and FIG. 10 is a partially enlarged cross-sectional view (cross-sectional view taken along a line III-III' in FIG. 9) illustrating a major portion of the bonding pad.

As illustrated in FIGS. 9 and 10, similar to the first embodiment, each bonding pad BP3 has a rectangular shape, and a surface region of one bonding pad BP3 is divided into a wire bonding region BP3$w$ and a probe region BP3$p$ longitudinally.

The bonding pad BP3 is formed of a metal film containing, for example, an aluminum film as a main material, and has a thickness of approximately 0.85 µm, for example. In a case that a pitch P3 between the adjacent bonding pads BP3 disposed along the respective side of the semiconductor chip 3 is 65 µm, for example, the dimensions of the bonding pad BP3 can be illustrated as an example in such a manner that, for example, one longitudinal side is 120 µm, one transverse side is 60 µm, and a distance between the adjacent bonding pads BP3 is 5 µm, for example. The longitudinal dimension of the wire bonding region BP3$w$ of the bonding pad BP3 is, for example, 50 µm and the longitudinal dimension of the bonding pad BP3 of the probe region BP3$p$ is, for example, 62.5 µm.

Each bonding pad BP3 is formed of wiring of the upper-most layer among a multilayer wiring layer of the semiconductor chip, and is exposed by an opening 6 formed in correspondence with the respective bonding pad BP3 in a protective film 13 formed so as to cover the multilayer wiring layer.

The protective film 13 has a laminated structured of, for example, a first insulating film 13$a$ having a first thickness, a second insulating film 13$b$ having a second thickness thicker than the first thickness, and a third insulating film 13$c$. However, at the periphery of the bonding pad BP3, a laminated film of the first insulating film 13$a$ and the second insulating film 13$b$ is formed so as to cover the periphery of the bonding pad BP3, and further the third insulating film 13$c$ is formed so as to cover the end of the laminated film over the bonding pad BP3. The first insulating film 13$a$ is a silicon oxide film formed by, for example, plasma CVD with the first thickness of, for example, 0.2 µm approximately. The second insulating film 13$b$ is a silicon oxide film formed by, for example, high density plasma CVD with the second thickness of, for example, 0.9 µm approximately. The thickness of the second insulating film 13$b$ is not limited to this but may be a thickness capable of filling the gap between the adjacent bonding pads BP3. Since the second insulating film 13$b$ is expected to fill the gap between the adjacent bonding pads BP3, it is preferred to be an insulating film having good coatability. The third insulating film 13$c$ is a silicon nitride film formed by, for example, plasma CVD with a thickness of, for example, 0.6 µm approximately. The third insulating film 13$c$ has a function of preventing moisture from entering from outside.

By forming the protective film 13 so as to fill the gap between the adjacent bonding pads BP3, the strength against breakage of the protective film 13 itself increases and thus it is possible to suppress cracking and peeling off in the protective film 13 due to the ultrasonic vibration even when employing, for example, nail head bonding in which ultrasonic vibration is used together with thermocompression while joining a metal ball at the tip end of the bonding wire to the wire bonding region BP3$w$ in the wire bonding region BP3$w$ of the bonding pad BP3.

After forming the laminated film of the first insulating film 13$a$ and the second insulating film 13$b$ and forming an opening 6$a$ in the laminated film over the bonding pad BP3 so as to overlap the periphery of the bonding pad BP3, the third insulating film 13$c$ is formed to form the opening 6 in the third insulating film 13$c$ over the bonding pad BP3 so as to cover the end of the laminated film, and thereby the laminated film is completely covered with the third insulating film 13$c$, so that the moisture resistance of the semiconductor chip can be improved.

Even in a case of forming the third insulating film 13$c$ so as to cover the laminated film formed of the first insulating film 13$a$ and the second insulating film 13$b$, the area of the wire bonding region BP3$w$ is preferred to be larger in order to obtain good joint between the metal ball and the bonding pad BP3 in the wire bonding region BP3$w$, and also the area of the probe region BP3$p$ is preferred to be wider in order not to make the probe contact with the protective film 13 overlapping the periphery of the bonding pad BP3 in the probe region BP3$p$. With that, in the third embodiment, similar to the first embodiment, the overlapping width of the bonding pad BP3 and the protective film 13 in the wire bonding region BP3$w$ is 5 µm, and the overlapping width of the bonding pad BP3 and the protective film 13 in the probe region BP3$p$ is 2.5 µm. Therefore, in the wire bonding region BP3$w$, the overlapping width of the laminated film formed of the first insulating film 13$a$ and the second insulating film 13$b$ constituting, for example, a lower portion of the protective film 13 is 2.5 µm and the overlapping width of the third insulating film 13$c$ constituting an upper portion of the protective film 13 is 5 µm, and in the probe region BP3$p$, the overlapping width of the laminated film formed of the first insulating film 13a and the second insulating film 13b constituting, for example, the lower portion of the protective film 13 is 1.25 µm and the overlapping width of the third insulating film 13c constituting the upper portion of the protective film 13 is 1.25 µm.

As just described, according to the third embodiment, in addition to that the overlapping width of the protective film 13 in the wire bonding region BP3w of the bonding pad BP3 is made wider than the overlapping width of the protective film 13 in the probe region BP3p of the bonding pad BP3, the protective film 13 is formed so as to fill the gap between the adjacent bonding pads BP3 and thus the strength against breakage of the protective film 13 itself can be increased. This enables to suppress crack generation, in the wire bonding region BP3w of the bonding pad BP3, in the protective film 13 even more than the first embodiment even when the metal ball runs over the periphery of the bonding pad BP3. In addition, since the entire region other than the opening 6 can be covered with the third insulating film 13c having a function of preventing moisture from entering from outside, it is possible to prevent moisture from entering even more than the first embodiment. This enables to secure the moisture resistance of the semiconductor device even in a case that a halogen free member is used for the semiconductor device and the adhesion (adherence) between, for example, the surface of the semiconductor chip and the resin member (resin material) decreases and thus moisture enters.

Although the third embodiment is described as one example of modifying the bonding pads BP1 and the openings 6 according to the first embodiment, the modification is also applicable to the bonding pads BP2 and the openings 12 illustrated in the second embodiment.

(Fourth Embodiment)

A fourth embodiment describes shapes of power source bonding pads and openings capable of preventing generation of cracks in a protective film in the power source bonding pads.

Figure 11:
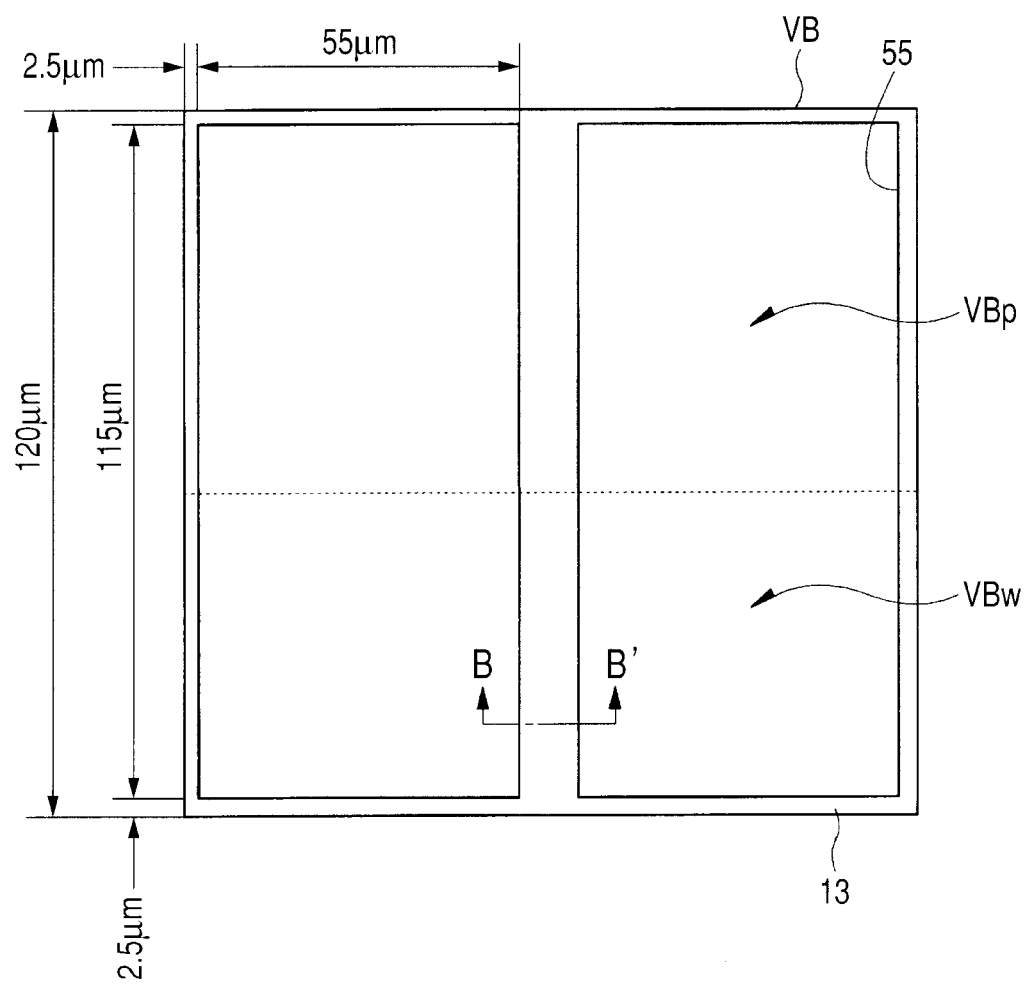
FIG. 11 is an enlarged plan view illustrating a major portion of a power source bonding pad that the present inventors have reviewed.
Figure 12:
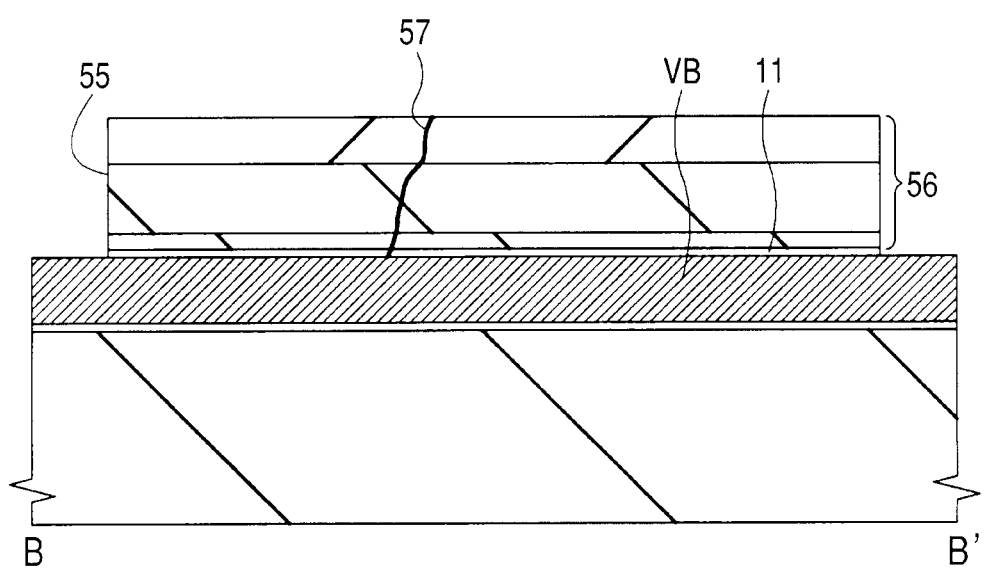
FIG. 12 is a partially enlarged cross-sectional view (cross-sectional view taken along a line B-B' in FIG. 11) illustrating a major portion of the power source bonding pad that the present inventors have reviewed.

Before describing the fourth embodiment, a brief description is given to a shape of a power source bonding pad that the present inventors have reviewed using FIGS. 11 and 12 as the shape of the power source bonding pad according to the fourth embodiment is considered to be more explicit. FIG. 11 is an enlarged plan view illustrating a major portion of a power source bonding pad, and FIG. 12 is a partially enlarged cross-sectional view (cross-sectional view taken along a line B-B' in FIG. 11) illustrating a major portion of the power source bonding pad.

As illustrated in FIGS. 11 and 12, a power source bonding pad VB that the present inventors have reviewed has a quadrangular shape (for example, 125 µm×120 µm), and in an upper layer of the power source bonding pad VB, a protective film 56 is formed with two rectangular openings (for example, 55 µm×115 µm) 55. From the respective two openings 55, a surface region of the power source bonding pad VB divided into a wire bonding region VBw and a probe region VBp is exposed. However, in the power source bonding pad VB in such a shape, as the two wire bonding regions VBw exposed from the two openings 55 are joined with a metal ball at the tip end of a respective bonding wire by, for example, nail head bonding in which ultrasonic vibration is used together with thermocompression, a crack 57 may be generated not only in a region of the periphery of the power source bonding pad VB overlapping the protective film 56 but also in the protective film 56 positioned between the two openings 55.

Figure 13:
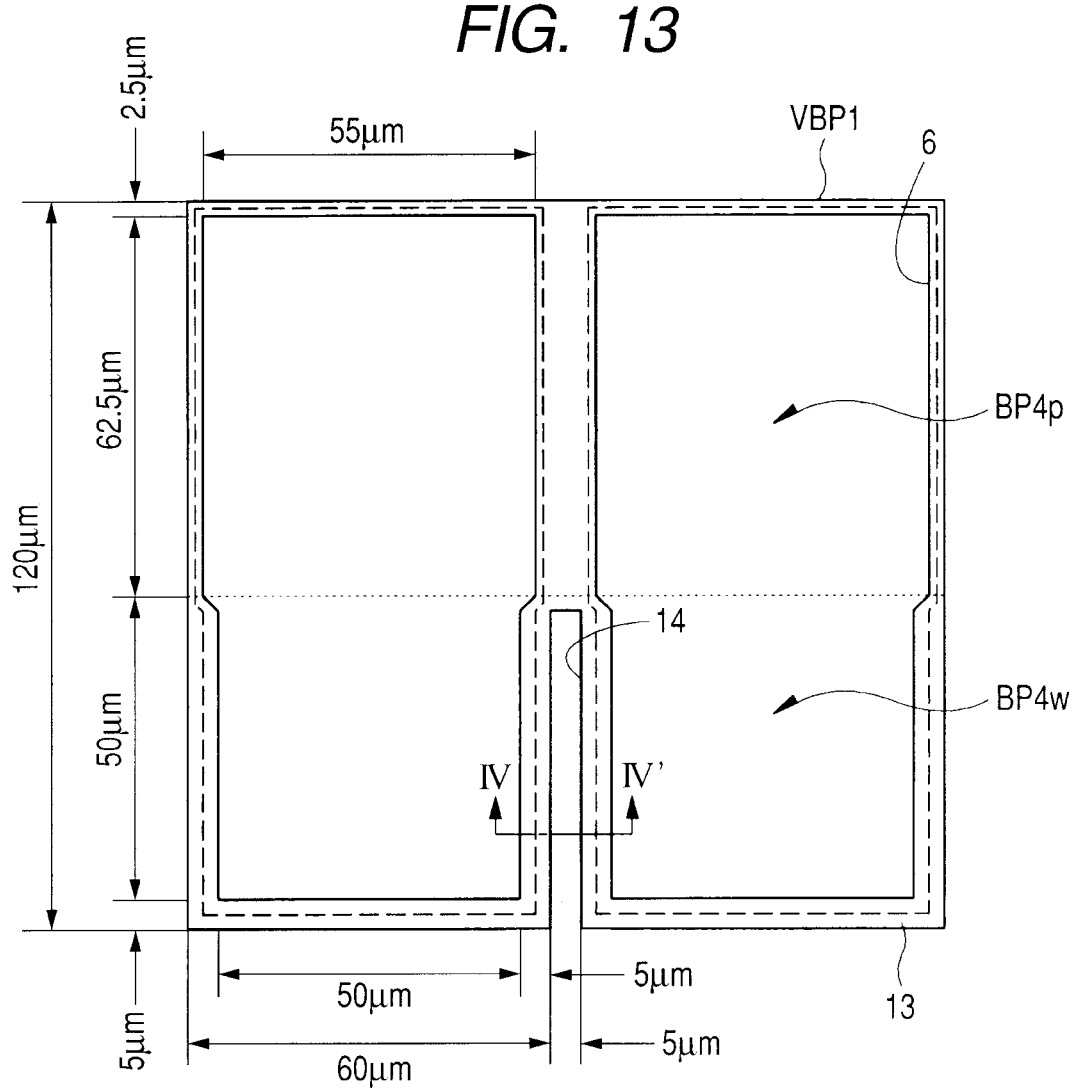
FIG. 13 is an enlarged plan view illustrating a major portion of a power source bonding pad according to a fourth embodiment.
Figure 14:
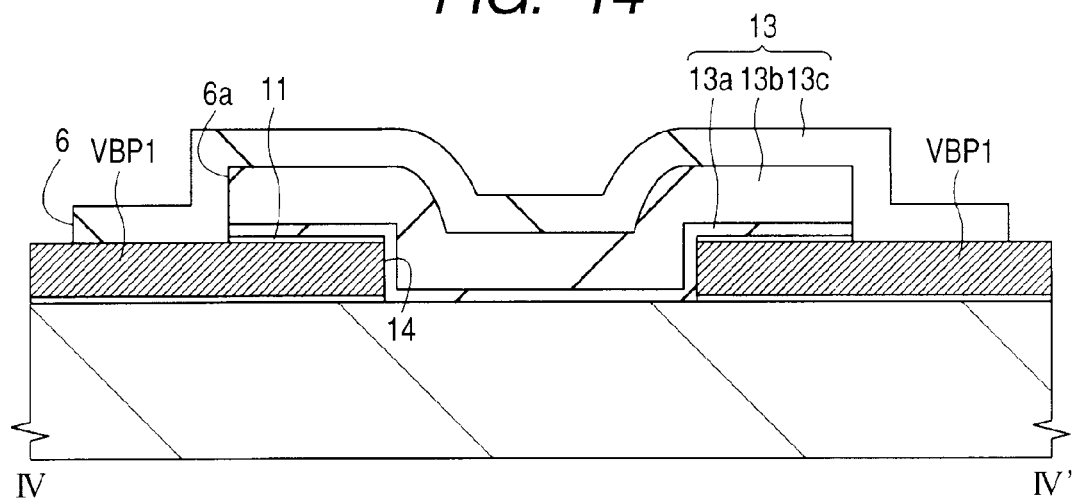
FIG. 14 is a partially enlarged cross-sectional view (cross-sectional view taken along a line IV-IV' in FIG. 13) illustrating a major portion of the power source bonding pad according to the fourth embodiment.
Figure 15:
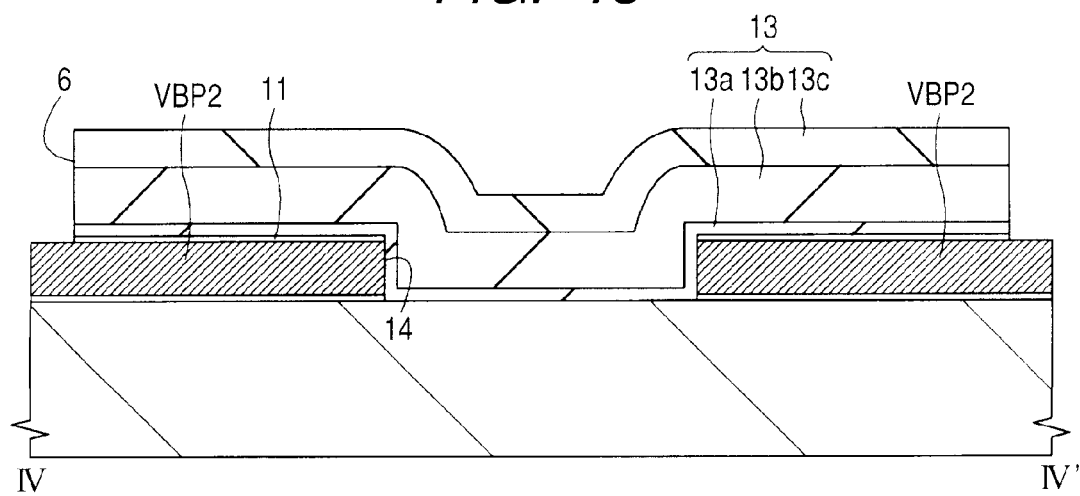
FIG. 15 is a partially enlarged cross-sectional view illustrating a major portion of a modification of the power source bonding pad according to the fourth embodiment.
Figure 16A:
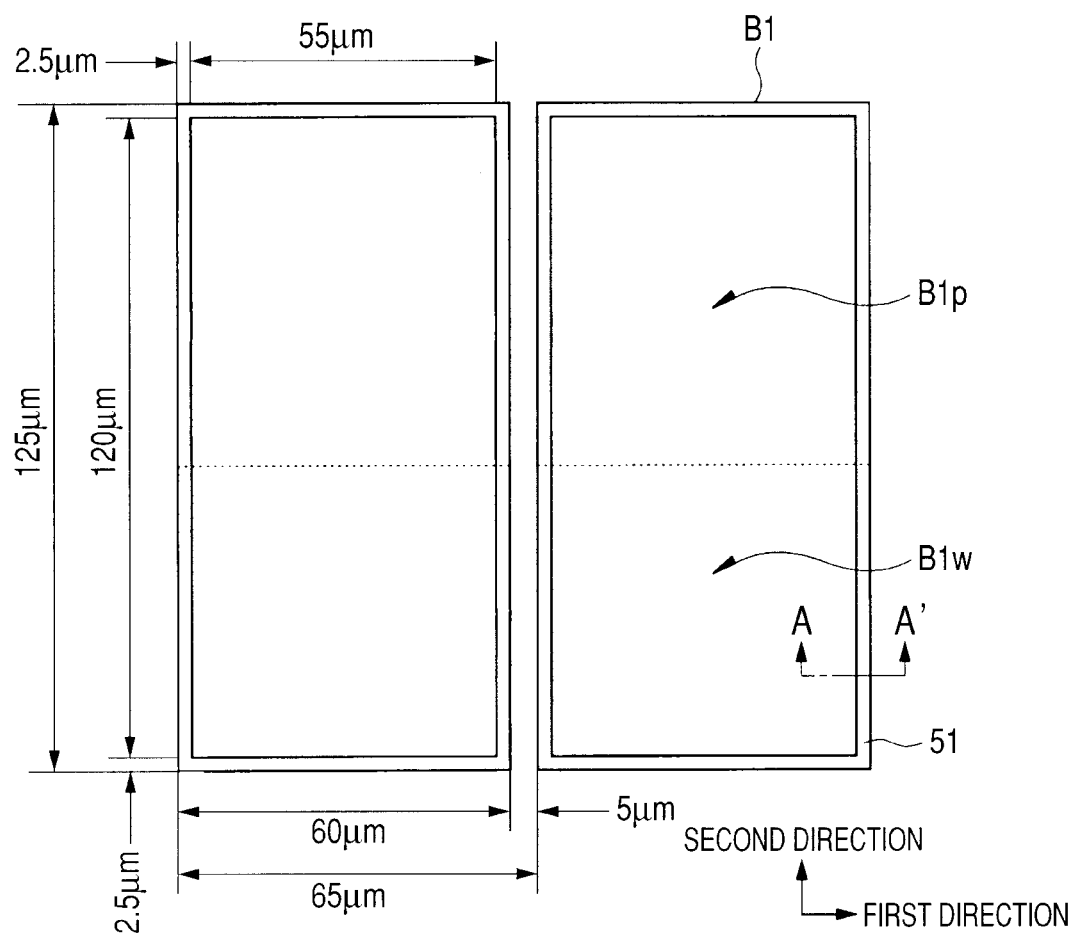
FIG. 16A is an enlarged plan view illustrating a major portion of bonding pads that the present inventors have reviewed.
Figure 16B:
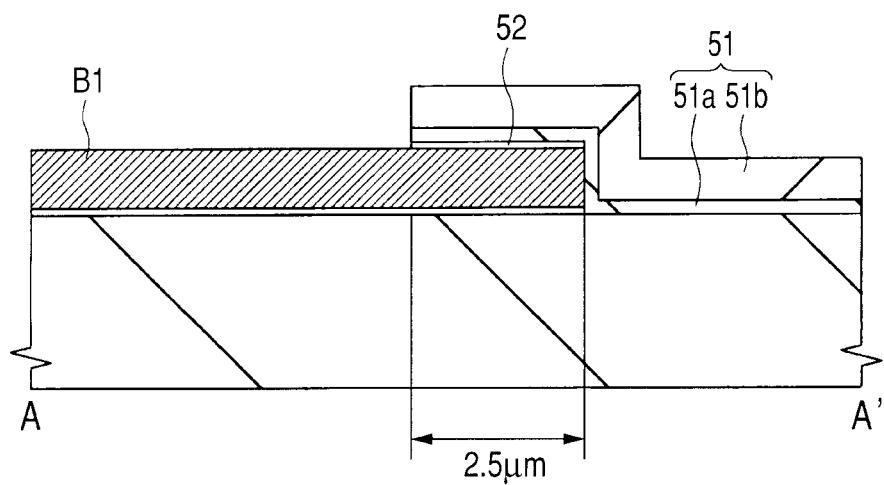
FIG. 16B is an enlarged cross-sectional view of a major portion of the bonding pad taken along a line A-A' in FIG. 16A.
Figure 17:
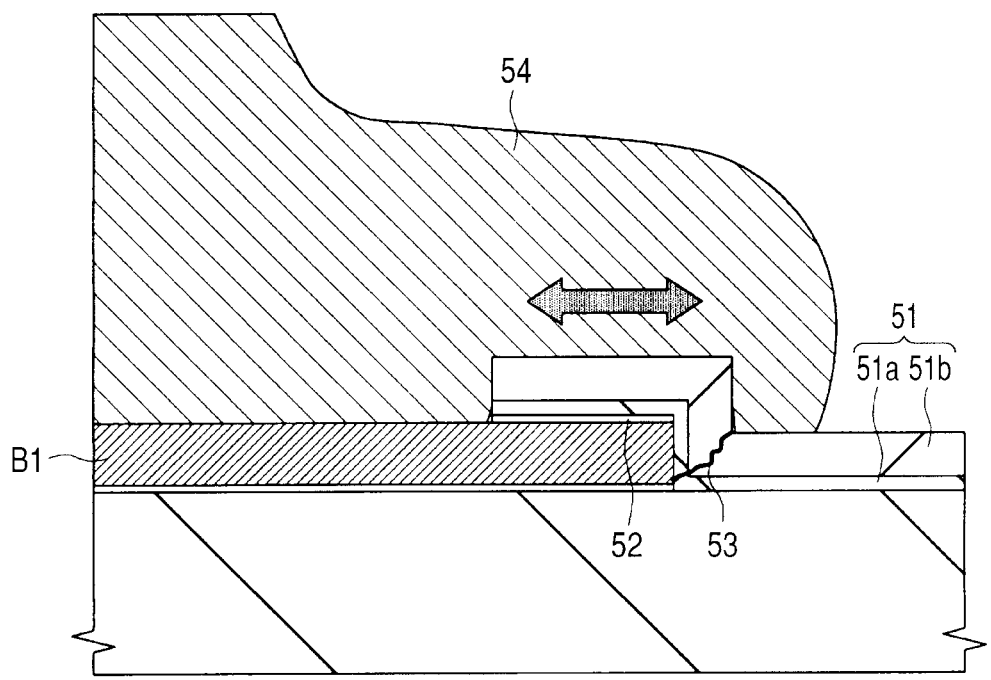
FIG. 17 is a cross-sectional view of a major portion of a bonding pad illustrating one example of a crack in a protective film.

A description is given to the shape of the power source bonding pad according to the fourth embodiment using FIGS. 13 and 14. FIG. 13 is an enlarged plan view illustrating a major portion of a power source bonding pad, and FIG. 14 is a partially enlarged cross-sectional view (cross-sectional view taken along a line IV-IV' in FIG. 13) illustrating a major portion of the power source bonding pad. In addition, FIG. 15 illustrates a modification of the power source bonding pad according to the fourth embodiment.

As illustrated in FIGS. 13 and 14, a power source bonding pad VBP1 according to the fourth embodiment has roughly same shape as that of coupling two of the bonding pads BP3 described in the third embodiment. However, in the power source bonding pad VBP1, although one probe region BP4p and the other probe region BP4p are connected to each other, one wire bonding region BP4w and the other wire bonding region BP4w are not connected to each other.

That is, a protective film 13 having two openings 6 that exposes a part of an upper face of the power source bonding pad VBP1 across the wire bonding regions BP4w and the probe regions BP4p is formed in the upper layer of the power source bonding pad VBP1, and the wire bonding regions BP4w and the probe regions BP4p of the power source bonding pad VBP1 are exposed from the two openings 6 respectively. A slit 14 is provided only in the wire bonding region BP4w in the power source bonding pad VBP1 between the two openings 6. The slit 14 has a width of, for example, 5 µm.

For example, in a case of joining a metal ball to each of the two wire bonding regions BP4w by employing nail head bonding in which ultrasonic vibration is used together with thermocompression, since the stress and the like imposed on the protective film 13 by the ultrasonic vibration can be moderated in the portion cut for the slit 14 by providing the slit 14, as just described, between one of the wire bonding regions BP4w and the other, it is possible to prevent crack generation in the protective film 13 positioned between the two openings 6. Further, similar to the first embodiment, by determining the width of the protective film 13 overlapping the periphery of the power source bonding pad VBP1 in the wire bonding region BP4w as, for example, 5 µm, it is also possible to prevent cracking in the protective film 13 generated in a side wall of an end of the power source bonding pad VBP1. By determining the width of the protective film 13 overlapping the periphery of the power source bonding pad VBP1 in the probe region BP4p as, for example, 2.5 µm, it is possible to prevent breakage in the protective film 13 over the power source bonding pad VBP1 by a probe.

FIG. 15 illustrates a modification of the power source bonding pad according to the fourth embodiment. FIG. 15 is a partially enlarged cross-sectional view illustrating a major portion of a modification of the power source bonding pad.

In the power source bonding pad VBP1 illustrated in FIG. 14 above, after forming a two-layer film by sequentially depositing the first insulating film 13a and the second insulating film 13b thereon and forming the opening 6a in the two-layer film once, the third insulating film 13c is formed over the two-layer film to completely cover the two-layer film, and the opening 6 is formed in the third insulating film 13c. In contrast, in the power source bonding pad VBP2 illustrated in FIG. 15, after forming a three-layer film by sequentially depositing the first insulating film 13a, the second insulating film 13b, and the third insulating film 13c thereon, the opening 6 is formed in the three-layer film. By employing a structure of the power source bonding pad VBP2, it is possible to reduce the number of manufacturing steps than in a case of manufacturing the power source bonding pad VBP1.

As just described, according to the fourth embodiment, by determining the overlapping width of the periphery of the power source bonding pad VBP1 in the wire bonding regions BP4w of the power source bonding pad VBP1 as a width not to crack in the protective film 13 even when the metal ball at the tip end of the bonding wire runs over the periphery of the power source bonding pad VBP1 and further providing the slit 14 between two wire bonding regions BP4w, it is also possible to suppress crack generation in the protective film 13 between the two openings 6 in the power source bonding pad VBP1.

Although the specific descriptions are given above to the present invention made by the present inventors based on the embodiments, it should be naturally understood that the present invention is not limited to the embodiments but various modifications are available without departing from the scope of the spirit.

The present invention is applicable to a semiconductor device with a semiconductor chip mounted thereon having bonding pads used for wire bonding connection, flip chip connection, or the like.

What is claimed is:

1. A semiconductor device, comprising:
   a semiconductor chip having a first main surface, a second main surface opposite the first main surface, a side extending in a first direction, and a plurality of bonding pads formed on the first main surface and extending along the side,
   the first main surface of the semiconductor chip being covered by a protective film in which a plurality of openings are formed,
   the plurality of bonding pads including a plurality of first bonding pads and a plurality of second bonding pads,
   an upper surface of each of the first and second bonding pads being exposed from a corresponding one of the openings,
   the upper surface of each of the first and second bonding pads being sectioned into a bonding region and a probe region,
   wherein, in a plan view, the bonding region of each of the plurality of first bonding pads is arranged closer to the side of the semiconductor chip than the probe region of each of the plurality of first bonding pads in a second direction that is perpendicular to the first direction,
   wherein, in the plan view, the probe region of each of the plurality of second bonding pads is arranged closer to the side of the semiconductor chip than the bonding region of each of the plurality of second bonding pads in the second direction,
   wherein, in the plan view, the probe region of each of the plurality of first bonding pads and the probe region of each of the plurality of second bonding pads are arranged side by side in the first direction, and
   wherein a contact trace is formed in the probe region of each of the first and second bonding pads in the plan view.

2. The semiconductor device according to claim 1,
   wherein, in the plan view, the probe region of each of the plurality of first bonding pads is arranged closer to the side of the semiconductor chip than the bonding region of each of the plurality of second bonding pads in the second direction.

3. The semiconductor device according to claim 2, further comprising:
   a wiring substrate having:
      a first surface in which a plurality of bonding leads are formed; and
      a second surface opposite the first surface;
   a pad region in which the bonding pads are formed and which is disposed along a periphery of the semiconductor chip over the main surface of the semiconductor chip; and
   a core region in which an integrated circuit is formed and which is disposed in an inner side of the pad region,
   wherein:
      the semiconductor chip is mounted over the first surface of the wiring substrate such that the first surface of the wiring substrate and the back surface of the semiconductor chip face each other;
      the bonding pads and the bonding leads are electrically coupled by bonding wires; and
      the bonding pads are disposed such that the bonding region is closer to the side of the semiconductor chip than the probe region.

4. The semiconductor device according to claim 3,
   wherein the bonding wires are gold wires, and
   the bonding pads are metal films containing an aluminum film as a main material.

5. The semiconductor device according to claim 4,
   wherein the protective film is disposed between adjacent bonding pads.

6. The semiconductor device according to claim 5,
   wherein the protective film is formed of a laminated film including a plurality of insulating films, and
   the insulating film in an uppermost layer is a silicon nitride film.

7. The semiconductor device according to claim 2,
   wherein, in the plan view, the probe region of each of the plurality of first bonding pads is arranged closer to the side of the semiconductor chip than the probe region of each of the plurality of second bonding pads in the second direction.

8. The semiconductor device according to claim 1,
   wherein, in the plan view, each of the plurality of bonding pads is disposed alternately with each other in a staggered fashion along the side of the semiconductor chip in the first direction.

9. The semiconductor device according to claim 1,
   wherein an opening in the protective film has a convex shape in the plan view.

* * * * *